United States Patent [19]

Ramsey et al.

[11] Patent Number: 5,244,140

[45] Date of Patent: * Sep. 14, 1993

[54] ULTRASONIC BONDING PROCESS BEYOND 125 KHZ

[75] Inventors: Thomas H. Ramsey, Garland; Rafael C. Alfaro, The Colony, both of Tex.

[73] Assignee: Texas Instruments Incorporated, Dallas, Tex.

[*] Notice: The portion of the term of this patent subsequent to Apr. 13, 2010 has been disclaimed.

[21] Appl. No.: 767,740

[22] Filed: Sep. 30, 1991

[51] Int. Cl.$^5$ .................... B23K 20/10; H01L 21/607
[52] U.S. Cl. ................................ 228/110.1; 228/1.1; 228/180.5
[58] Field of Search ............... 228/179, 110, 1.1, 4.5

[56] References Cited

U.S. PATENT DOCUMENTS

| | | | |
|---|---|---|---|
| 3,054,309 | 9/1962 | Elmore et al. | 228/1.1 |
| 3,641,660 | 2/1972 | Adams et al. | 228/4.5 |
| 3,776,447 | 12/1973 | Adams et al. | 228/4.5 |
| 4,415,115 | 11/1983 | James | 228/179 X |
| 4,842,662 | 6/1989 | Jacobi | 228/110 X |
| 4,854,494 | 8/1989 | von Raber | 228/1.1 X |
| 4,889,274 | 12/1989 | Ramsey | 228/179 |

OTHER PUBLICATIONS

"Very high energy ultrasonics" E. A. Neppiras, Special Article *British Journal of Applied Physics* vol. 11, Apr., 1960, pp. 143–150.
"Ultrasonics: An Aid to Metal Forming?", Langenecker et al., *Metal Progress*, vol. 85, Apr., 1964, pp. 97–101.
"Effects of Ultrasound on Deformation Characteristics of Metals", Langenecker, *IEEE Transactions on Sonics and Ultrasonics*, vol. SU-13, No. 1, Mar., 1966, pp. 1–8.
"A Note on the Effect of Ultrasonic Activation on Diffusion and Sintering", Hochman et al., *International Journal of Powder Metallurgy*, vol. 2, 1966, pp. 15–16.
"The Influence of Ultrasonic Energy on Kinetic Processes in Solids", Hayes et al., *IEEE Journal on Sonics and Ultrasonics*, vol. SU-16, No. 2, Apr., 1969, pp. 68–75.
"Intermetallic Formation in Gold-Aluminum Systems" E. Philofsky, *Solid State Electronics*, vol. 13, 1970, pp. 1391–1399.
"High-Frequency Fatigue in Aluminum", Chevalier et al., *J. Appl. Phys.*, vol. 43, No. 1, Jan., 1972, pp. 73–77.
"The Formation of Ultrasonic Bonds Between Metals", K. Joshi, *Welding Journal*, vol. 50, Dec., 1971, pp. 840–848.
"Metallurigical Failure Modes of Wire Bonds", G. Harman, 12th Annual Proceedings, Reliability Physics Symposium, Apr., 1974, pp. 131–141.
"Sonochemistry", K. Suslick, *Science*, vol. 247, Mar., 1990, pp. 1439–1445.
"Phenomenological Considerations in Ultrasonic Welding", Jones et al., *Welding Research Supplement*, Jul., 1961, pp. 289–305.

*Primary Examiner*—Kenneth J. Ramsey
*Attorney, Agent, or Firm*—W. James Brady, III; B. Peter Barndt; Richard L. Donaldson

[57] ABSTRACT

An (10) and method is provided for bonding wire (12) to the bond sites (28) of integrated circuits (14). In preferred embodiments gold wire (12) is bonded to aluminum bond pad (28). Apparatus (10) includes a high frequency ultrasonic energy source (20) designed to provide ultrasonic energy at frequencies above about 125 kHz. The ultrasonic energy is imparted to the bonding interface (32) via transducer (18) and capillary (16). The transducer is modified in length and tool clamp point (40) is sited on transducer (18) so that the wavelength of the high frequency ultrasonic energy is at the antinodal point in its application to interface (32) and thus is optimized. In the preferred embodiments of the process the ultrasonic energy is applied at about 350 kHz at ambient temperature. In this fashion, the bond formed between bond end (30) and bond pad (28) is optimized in terms of shear strength, bonding time and processing temperatures.

Particularly beneficial results are noticed with respect to aluminum alloy bond pads such as Al, 2% copper, which were particularly troublesome in terms of intermetallic formation and bond strength in the prior art. Thus according to the invention, the use of high frequency ultrasonic energy in the aforementioned range, superior strength bonds are formed with greater processing parameter flexibility.

18 Claims, 2 Drawing Sheets

ULTRASONIC BONDING PROCESS BEYOND 125 KHZ

CROSS-REFERENCE TO RELATED APPLICATIONS

The following coassigned patent applications are hereby incorporated herein by reference:
filing date Sep. 30, 1991; U.S. application Ser. No.
filing date Sep. 30, 1991; U.S. application Ser. No.
filing date Sep. 30, 1991; U.S. application Ser. No.

BACKGROUND OF THE INVENTION

1. Field of the Invention

This invention relates to integrated circuit (IC) interconnections. More particularly, it relates to IC interconnections utilizing high frequency ultrasonic energy.

2. Description of the Prior Art

The standard technique for making circuit interconnections for plastic encapsulated semiconductor devices utilizes the bonding of metals, for example, gold wire to aluminum or aluminum alloy surfaces (e.g. bond pads). The bond or weld formed eventually results in an intermetallic structure of several possible phases, depending on time and temperature and dictated by diffusion behavior. The highest bond strength will be obtained by initiating the maximum intermetallic coverage.

Contaminated surfaces, unfeasibly low temperatures and nonoptimum bonding parameters all contribute to less than adequate reaction of the gold and aluminum surfaces. The maximum bond strength and highest quality bond is obtained through optimum phase growth. Hence, a bonding process is needed to optimize the reactivity of the bonding materials, e.g. gold and aluminum. Additionally, it would be advantageous to achieve a process wherein lower temperatures and shorter bonding times could be achieved for greater processing flexibility. A process allowing ambient temperature would be extremely desirable.

In addition, a particular problem exists with aluminum alloys (e.g. Al, 2% Cu; or Al, 1% Si, 0.5% Cu). With aluminum alloys even greater reactivity retardation is experienced, thus ultimately damaging the bond strengths involving aluminum alloys.

What is needed is a process which facilitates optimum reactivity of metals such as gold and aluminum in the bonding process for greater (perhaps even 100%) coverage of the cross-sectional area of the bond. Also needed is a process which allows for greater parameter flexibility, such as lower (even ambient) temperatures and/or shorter bonding times and/or lower pressures.

SUMMARY OF THE INVENTION

The problems outlined above are in large measure solved by the method and apparatus in accordance with the present invention. That is to say the invention hereof provides a bonding process yielding greater cross-sectional coverage, resulting in greater bond strength. Furthermore, the invention provides a flexible process wherein parameters such as temperature, time and pressure can advantageously be adjusted without detrimental effect. Indeed, the invention provides a process wherein bonding can be performed at ambient temperatures. Hence, the invention provides stronger bonds with greater process flexibility in the making of those bonds. The invention provides these benefits utilizing high frequency ultrasonic (H.F. US) energy with appropriately modified hardware (e.g. the transducer and piezoelectric crystals).

In addition, by utilizing H.F. US energy above about 125 kHz, the present invention solves the above mentioned coverage problem heretofore associated with aluminum alloys bonded to gold.

In preferred embodiments, the invention provides a transducer and piezoelectric crystals mounted thereon, energized with ac current at about 350 kHz. A capillary is mounted on the transducer and feeds gold wire onto an aluminum bond pad with the interface between a bond end (of the gold wire) and a bond pad being at ambient temperature (about 27° C.) in accordance with the invention.

Generally speaking, the invention provides a method of forming a microelectronic bond, the method comprising the steps of:
(a) providing a conductive bond site;
(b) providing a wire having a bond end;
(c) contacting the bond end of the wire to the bond site, the bond end and the bond site presenting an interface therebetween; and
(d) applying ultrasonic energy at the interface above about 125 kHz.

DESCRIPTION OF THE PREFERRED EMBODIMENT

The thermosonic bond process is a widely used method in the semiconductor industry. Generally, this process uses low frequencies (around 60 kHz) applied to an ultrasonic transducer. The present invention deals with frequencies above about 125 kHz, and it is at these frequencies that parameters such as ultrasonic power, bond time, mash force (pressure) and temperature are flexibly and advantageously modified. In particular, effective bonding can occur at ambient temperatures. It should be noted that for purposes of this application, high frequency ultrasonic energy (H.F. US) is defined at above about 100 kHz, but the present invention is particularly concerned with frequencies above about 125 kHz.

Figure 1:
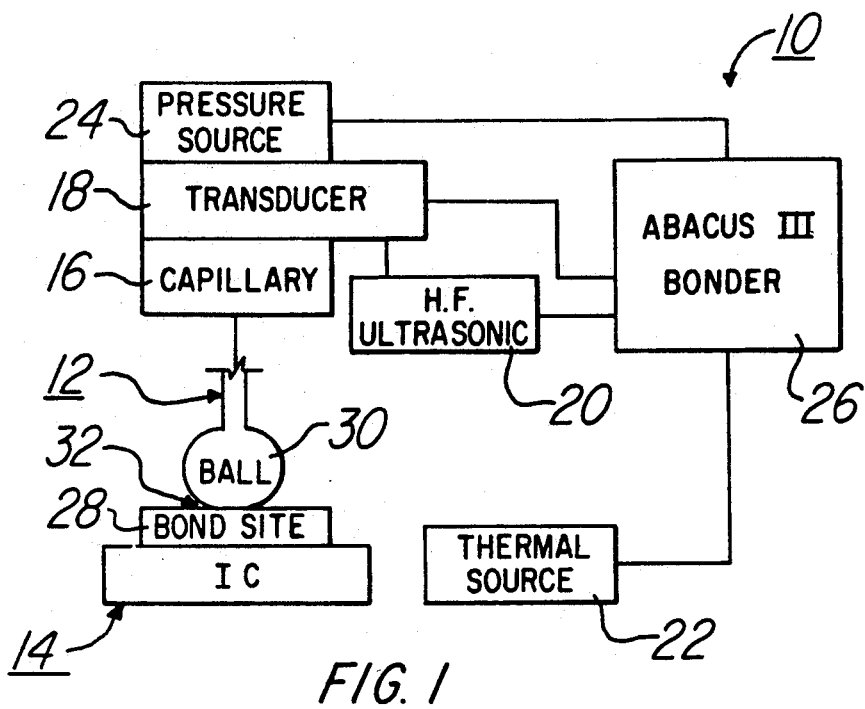
FIG. 1 is partially a block diagram, partially a schematic representation of a bonding apparatus used for ball-bonding wire to a microelectronic integrated circuit in accordance with the invention.

Referring now to the drawings in general and FIG. 1 in particular, a bonding apparatus 10 is depicted in block diagram with a wire 12 and a microelectronic integrated circuit 14. Bonding apparatus 10, according to the invention, utilizes H.F. US to create microelectronic interconnection bonds. The frequency range for the ultrasonic energy is above about 125 kHz. Apparatus 10 includes a capillary 16, a modified transducer 18, a high frequency ultrasonic energy source 20, a thermal source 22, a pressure source 24, and the remainder of apparatus 10 is represented by the box at reference numeral 26.

IC 14 is conventional in nature and could be, for example, a 16 megabit DRAM (dynamic random access memory) such as manufactured by Texas Instruments, Incorporated of Dallas, Texas. IC 14 substantially includes manufacturing grade monocrystalline silicon for the substrate but other materials could also be used. For example, but not by way of limitation, gallium arsenide or germanium could be used for the substrate of IC 14. Other types of memory ICs are within the scope of the present invention, such as static random access memories. Indeed, logic dies or linear semiconductors such as power devices could also be the subject of the present process. Additionally IC 14 need not be a VLSI chip but could also be an MSI or SSI chip, and indeed could be a discrete or hybridized component.

IC 14 includes a bond site 28. In preferred embodiments bond site 28 is a bond pad substantially made of aluminum alloy (2% copper). Other aluminum alloys such as 1% silicon, 0.5% copper could be utilized and indeed other metals or alloys could be used for bond site 28, either separately or in conjunction with aluminum.

Figure 3A:
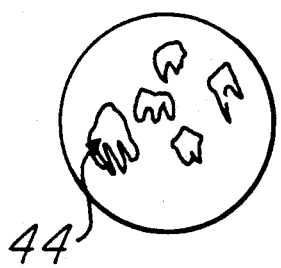
FIGS. 3A-3C are sectional views depicting various stages of intermetallic formation at interfaces where bonding occurs.
Figure 3B:
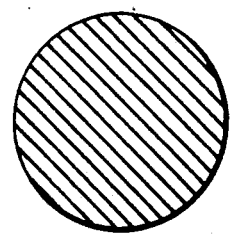
Figure 3C:
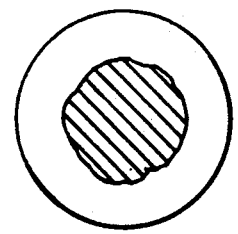
Figure 4:
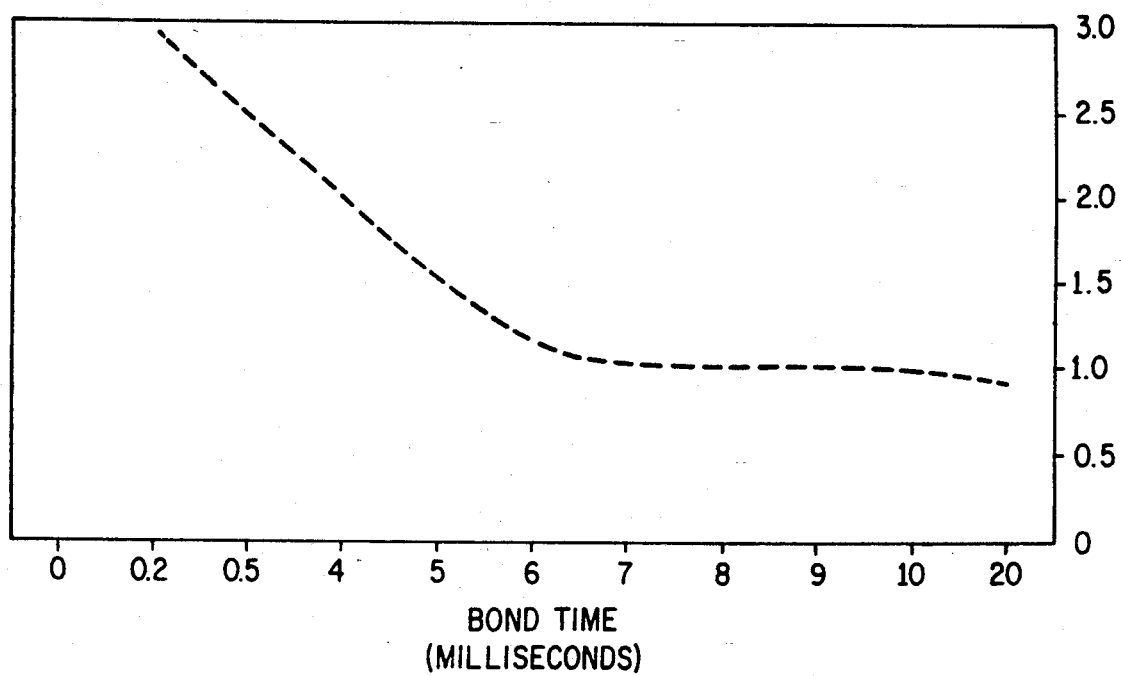
FIG. 4 graphically represents the relationship between ultrasonic frequency and bond time at 300° C. for bonding gold wire to pure aluminum.

Wire 12 is pure gold in the preferred embodiment and includes bond end 30. Alternatively, wire 12 could be made of a gold alloy, or wires made of other metals or alloys could also be used. Note the interface as indicated by reference numeral 32 is in a location analogous to the cross-sectional areas as depicted in FIGS. 3A-3C.

Capillary 16 acts as a conduit for wire 12 and imparts pressure and ultrasonic energy at the interface 32 during the bonding process, as is well known in the art. Capillary 16 is conventional in nature and is made of a synthetic resin material.

Figure 2:
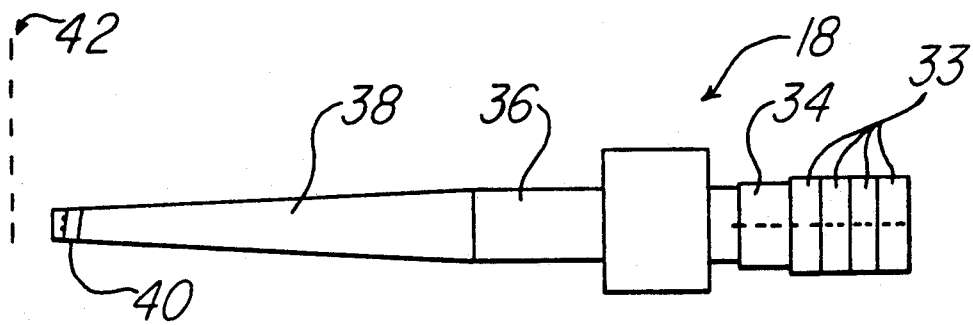
FIG. 2 is sectional elevational view of a transducer used in the bonding apparatus.

Referring to FIG. 2, metallic transducer (or horn) 18 is about ten centimeters in length and includes four piezoelectric crystals 33 on tail end 34. Horn 18 also includes a body portion 36 and a tapered front end 38 having a tool clamp point 40 where capillary 16 is mounted. Horn 18 is modified in length, and the number of piezoelectric crystals 37 and positioning of tool clamp point 40 are modified as compared to prior horns. The dashed line and reference numeral 42 indicates about where the tool clamp point is typically positioned in the somewhat longer transducer for the prior processing frequency of about 62.5 kHz. Note transducer 18 is shortened so that tool clamp point 40 is at the optimum position for imparting H.F. US energy. For purposes of the following discussion on effective transducer length the reader is referred to FIGS. 6 and 7 of the above incorporated reference, U.S. application Ser. No. 768,501 and accompanying text.

As an example for the sake of comparison, a prior art transducer is effectively about 3.15 inches long, and is designed to transmit US energy at about 62.5 kHz so that 1.25 wavelengths are disposed along the effective length of the transducer.

The effective length of transducer 18 will very according to the application. Transducer 18, in the preferred embodiment, is designed to transmit 350 kHz H.F. US energy so that 2.25 wavelength are disposed along the effective length. If desired, the frequency and transducer length can be adjusted to accommodate 3.25 wavelengths, 4.25 wavelengths, etc. Thus, the effective length of transducer 18 is reduced compared to the effective length of the 62.5 kHz transducer. The specific reduction in length will depend on the H.F. US used and the design of the transducer, and these parameters will vary for different applications.

Referring again to FIG. 1, H.F. US source 20 is designed to provide an ac signal to piezoelectric crystals 33 in a range above about 125 kHz. Ultrasonic source 20 is conventionally connected to the crystals. The frequencies discussed are those applied to the piezoelectric crystals. Thus the ultrasonic frequency at the interface may be slightly different, as is well known in the art.

Thermal source 22 is conventional in nature and provides thermal energy at the interface 32 to facilitate the bonding process. Pressure source 24 is conventional in nature and provides pressure (mashing) to interface 32 via capillary 16.

The remainder of apparatus 10, symbolized by the box at reference numeral 26 includes control circuitry, mechanical armature, etc. In the preferred embodiment, bonding apparatus 10 is the Abacus III bonder incorporating some or all of the improvements of the present invention. For a further discussion of H.F. US energy bonding utilizing a thermally heated transducer, and axially aligned capillary and transducer with a substantially linear bond stroke in the Z direction, it is suggested to refer to the cross-referenced patent applications incorporated by reference. Each technique may have possible advantages in a specific technical application, in the context of the present invention. The Abacus III bonder is manufactured by Texas Instruments of Dallas, Texas. Other structural components and elements are not discussed in detail because of less direct relevance, but those skilled in the art will readily appreciate that such components and elements can be incorporated in apparatus 10.

The process of the present invention will now be discussed. Generally speaking, an IC 14 having a bond site 28 is appropriately secured on a chuck, lead frame, or the like (not shown) and then (when ball bonding as opposed to stitch bonding) wire 12 is heated for formation of ball 30 as is well known in the art. Bond end 30 is then contacted to bond site 28 so as to present an interface 32 where welding or bonding occurs.

When thermosonic bonding is utilized, as is the case in the preferred embodiment, a thermal source 22 is used to apply heat to interface 32 while capillary 16 positions and secures ball 30 at bond site 28 while transducer 18 provides ultrasonic energy and pressure source 24 applies mashing force via capillary 16. All of the above bonding steps are typically controlled by control circuitry (included in box 26) as is well known in the art.

For purposes of the present application, H.F. US means frequencies above about 100 kHz. Conversely, low frequency ultrasonic energy means ultrasonic energy at a frequency below about 100 kHz in the context of the present invention.

Referring now to FIGS. 3A-3C, various stages of intermetallic formation associated with microelectronic bonding or welding are illustrated. FIG. 3A shows somewhat limited intermetallic formation as illustrated by the spotty areas depicted at reference numeral 44. In the prior art, such partial coverage is common. This is the kind of intermetallic or bond formation that would be seen in a thermal range of about 175°-300° C. in the prior art, with ultrasonic energy around 60 kHz. Normal plastic encapsulation processing (e.g. 5 hours at 175° C.) will convert the interface of pure aluminum bonded to gold to 100% intermetallic coverage as illustrated at FIG. 3B. However, 5 hours at 175° C. with doped metallizations, particularly Al, 2%Cu, obtains only about 50% area coverage as shown at FIG. 3C.

In contradistinction, when the ultrasonic energy at a range above about 125 kHz is used in accordance with the present invention at a temperature range between about 175° C. and 300° C., full coverage (i.e. about 100%) is obtained as in FIG. 3B. Other alloys experiencing the intermetallic retardation illustrated by FIG. 3A include: 1) Al, Cu 0–4%; 2) silicon doped aluminum; 3) palladium doped aluminum; or combinations of the same. These commonly used alloys create a phase or bond intermetallic formation retardation effect (i.e. the phases grow very slowly) and hence minimize the actual welded area of the bond. Sometimes the bond does not grow at all beyond some definite percentage of the area. It is therefore useful to increase the welded area, strength and reliability of the bond by utilizing the H.F. US energy.

The apparent increase in intermetallic growth and area coverage is directly dependent on the higher frequency ultrasonic energy. The lower frequency (around 60 kHz) does not form a high level of welded bond structure with alloys as stated above, but with the higher frequency, a degree of chemical reactivity is obtained that results in 100% welded area or complete intermetallic area coverage and depth penetration. It effectively negates the phase growth retardation mechanism.

In addition, high frequency horn 18 (i.e. above 125 kHz)—when coupled with specific bonding parameters, such as pressure, allows for almost 100% bond area coverage at lower temperatures such as 175° C. Indeed, adequate bonding at ambient temperatures can be achieved when H.F. US energy is used. In particular, adequate bonding has been observed at about 350 kHz and about 27° C. The H.F. US energy will give substantially 100% area coverage at higher temperatures such as 300° C. Thus, much more reliable bonds made of alloyed metallization required for certain types of circuit connections can be made with the H.F. US energy when coupled with the proper set of parameters.

The time parameter controls how long the bonding energy is applied and it is normally expressed in milliseconds. For low temperature H.F. bonding, the range of time does not differ from the one used for higher temperature low frequency processes. But when high temperature and high frequency are used together, then the range changes toward shorter times, allowing in some cases the possibility of bonding below 1.0 milliseconds and still achieving full intermetallic formation. Optimum bonds have been formed at 300° C. with only 0.5 milliseconds bond time.

Although the invention has been described in detail herein with reference to its preferred embodiment and certain described alternatives, it is to be understood that this description is by way of example only, and is not to be construed in a limiting sense. It is to be further understood that numerous changes in the details of the embodiments of the invention, and additional embodiments of the invention, will be apparent to, and may be made by, persons of ordinary skill in the art having reference to this description. It is contemplated that all such changes and additional embodiments are within the spirit and true scope of the invention as claimed below.

What is claimed is:

1. A method of forming a microelectronic bond, the method comprising the steps of:
   (a) providing a conductive bond site;
   (b) providing a wire having a bond end;
   (c) contacting the bond end of the wire to the bond site, the bond end and the bond site presenting an interface therebetween; and
   (d) applying ultrasonic energy at the interface at a frequency above 300 kHz.

2. The method of claim 1 wherein step (d) is performed at substantially ambient temperature.

3. The method of claim 1 wherein step (d) is performed at about 27° C.

4. The method of claim 1 wherein step (d) is performed below about 200° C.

5. The method of claim 1 wherein step (d) is performed in a range of frequencies from about 125 kHz to about 2 MHz.

6. A method of forming a microelectronic bond, the method comprising the steps of:
   (a) providing a conductive bond site;
   (b) providing a wire having a bond end;
   (c) contacting the bond end of the wire to the bond site, the bond end and the bond site presenting an interface therebetween; and
   (d) applying ultrasonic energy at the interface at a frequency of about 350 kHz and about 27° C.

7. A method of forming a microelectronic bond, the method comprising the steps of:
   (a) providing a conductive bond site;
   (b) providing a wire having a bond end;
   (c) contacting the bond end of the wire to the bond site, the bond end and the bond site presenting an interface therebetween; and
   (d) applying ultrasonic energy at the interface at a frequency above about 125 kHz;
   wherein step (d) is performed for about 0.5 milliseconds.

8. A method of forming an intermetallic bond structure, comprising the steps of:
   providing a conductive metal bond site;
   providing a conductive metal wire having a bond end;
   contacting the bond end of the wire to the bond site such that the bond end and the bond site present an interface therebetween;
   providing ultrasonic energy having a frequency above approximately 125 kHz; and
   effecting intermetallic phase growth over substantially the entire interface during a bonding time period, including the step of applying the ultrasonic energy at the interface throughout the bonding time period.

9. The method according to claim 8, wherein said energy applying step is performed at substantially ambient temperature.

10. The method according to claim 8, wherein said energy applying step is performed at approximately 27° C.

11. The method according to claim 8, wherein said energy applying step is performed at a temperature below approximately 200° C.

12. The method according to claim 8, wherein said frequency is within a range of frequencies from approximately 125 kHz to approximately 2 mHz.

13. The method according to claim 8, wherein said bonding time period is no more than approximately 0.5 milliseconds.

14. The method according to claim 8, wherein said wire is provided within a generally tubular capillary structure, wherein said bond site is provided on an integrated circuit device, wherein said bond site is one of an aluminum alloy and substantially pure aluminum, and wherein said bond end is one of a gold alloy and substantially pure gold.

15. The method according to claim 14, wherein said energy applying step is performed at a temperature below 175° C.

16. The method according to claim 14, wherein said energy applying step is performed at a temperature of approximately 300° C.

17. The method according to claim 16, wherein said bonding time period is less than one millisecond.

18. The method according to claim 8, wherein said bonding time period is less than one millisecond.

* * * * *